United States Patent
McHugh et al.

(10) Patent No.: US 10,191,379 B2
(45) Date of Patent: Jan. 29, 2019

(54) REMOVING PHOTORESIST FROM A WAFER

(71) Applicant: APPLIED Materials, Inc., Santa Clara, CA (US)

(72) Inventors: Paul R. McHugh, Kalispell, MT (US); Kyle Moran Hanson, Kalispell, MT (US); John L. Klocke, Kalispell, MT (US); Eric J. Bergman, Kalispell, MT (US); Stuart Crane, Kalispell, MT (US); Gregory J. Wilson, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/606,883

(22) Filed: May 26, 2017

(65) Prior Publication Data

US 2017/0357158 A1    Dec. 14, 2017

Related U.S. Application Data

(60) Provisional application No. 62/350,078, filed on Jun. 14, 2016.

(51) Int. Cl.
*G03F 7/42* (2006.01)
*H01L 21/02* (2006.01)
*G03F 7/40* (2006.01)

(52) U.S. Cl.
CPC ............ *G03F 7/422* (2013.01); *G03F 7/40* (2013.01); *H01L 21/02087* (2013.01)

(58) Field of Classification Search
CPC ... G03F 7/422; G03F 7/40; G03F 7/42; H01L 21/02019; H01L 21/02041; H01L 21/02087; C23F 1/46

USPC ...... 438/745, 750, 759, 91, 93, 106; 216/83, 216/93, 91, 99, 106; 134/18, 25.1, 10, 134/34, 111; 156/345.11, 345.21, 345.54
See application file for complete search history.

(56) References Cited

U.S. PATENT DOCUMENTS

| | | | |
|---|---|---|---|
| 2005/0183755 A1* | 8/2005 | Fujishima | H01L 21/67248 134/56 R |
| 2013/0233351 A1* | 9/2013 | Brown | H01L 21/67017 134/18 |

(Continued)

FOREIGN PATENT DOCUMENTS

| | | |
|---|---|---|
| CN | 203736950 U | 7/2014 |
| JP | 4786351 B2 | 10/2011 |
| KR | 20150096888 A | 8/2015 |

OTHER PUBLICATIONS

International Search Report and Written Opinion for International Application No. PCT/US2017/034685, dated Aug. 23, 2017; 13 pages.

*Primary Examiner* — Lan Vinh
(74) *Attorney, Agent, or Firm* — Perkins Coie LLP; Kenneth H. Ohriner

(57) ABSTRACT

In systems and methods for removing a photoresist film off of a wafer, the wafer is moved into a bath of a process liquid in a process tank. The process liquid removes the photoresist film from the wafer. The process liquid is pumped from the process tank to a filter assembly and moved through filter media to filter out solids from the process liquid, and the filtered process liquid is returned to the process tank. A scraper scrapes the filter media to prevent clogging of the filter media by accumulated solids.

13 Claims, 4 Drawing Sheets

(56) References Cited

U.S. PATENT DOCUMENTS

| | | | |
|---|---|---|---|
| 2015/0047674 A1* | 2/2015 | Goodman | B08B 1/008 134/10 |
| 2015/0129409 A1* | 5/2015 | Lee | B01D 3/143 202/161 |
| 2015/0352476 A1 | 12/2015 | Arvin et al. | |

* cited by examiner

REMOVING PHOTORESIST FROM A WAFER

PRIORITY CLAIM

This application claims priority to U.S. Provisional Patent Application No. 62/350,078, filed Jun. 14, 2016.

FIELD OF THE INVENTION

The field of the invention is processors, systems, and methods for processing semiconductor material wafers, and similar workpieces or substrates for microelectronic devices.

BACKGROUND OF THE INVENTION

Microelectronic devices, such as semiconductor devices, are generally fabricated on and/or in semiconductor material wafers. In wafer level packaging applications, a thick film of photoresist is applied to the wafer and patterned via photolithography. One or more metals are plated through the pattern in the photoresist, to form microelectronic components or interconnections. The photoresist film is then stripped or removed in a using a process liquid, such as a solvent, which chemically reacts with the photoresist film to remove the photoresist film off of the wafer.

Removing the photoresist can be difficult due to the thickness of the photoresist film. During the removing step, some of the photoresist film, which is typically about 50 to 250 microns thick, often comes off the wafer in relatively large gelatinous or diaphanous-like pieces, referred to here as solids, which are not fully dissolved by the process liquid. This results in a large volume of photoresist pieces accumulating in the process liquid, which can degrade the process liquid, clog filters or other fluid components and require frequent cleaning of the processing system. Engineering challenges remain in providing systems and methods for removing photoresist films.

SUMMARY OF THE INVENTION

A processing system for stripping or removing photoresist off of a wafer has a process tank holding a bath of process liquid. The process liquid is pumped through a self-cleaning filter for filtering solids out of the process liquid. A mechanical scraper mechanically removes the filtered out solids from the filter media. The filter may optionally operate with a local back flush to periodically clean the filter media, with or without using the mechanical scraper. Maintenance requirements, process liquid consumption, and filter consumable costs are reduced.

DETAILED DESCRIPTION

Figure 1:
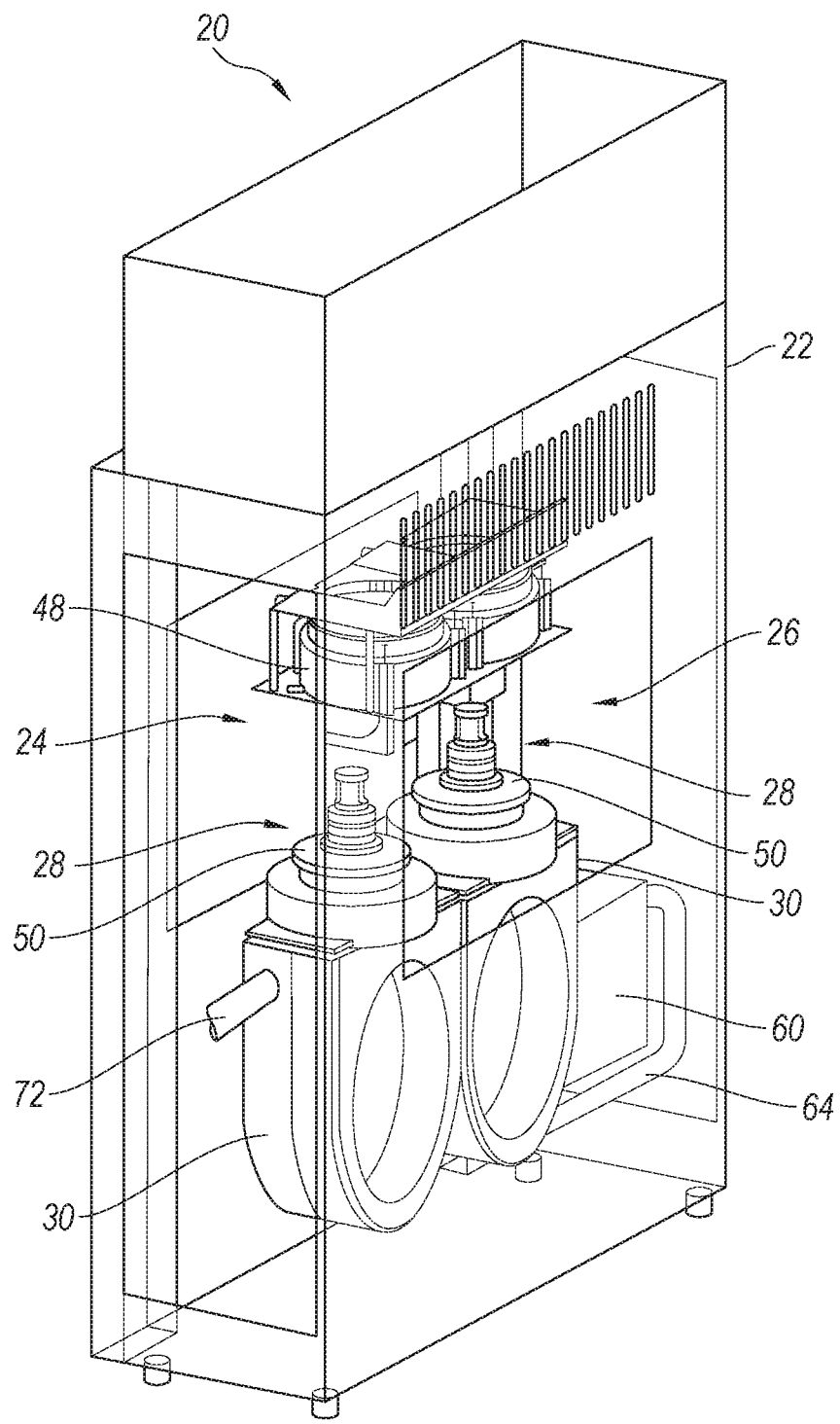
FIG. 1 is a perspective view of a processing system for removing photoresist and similar films from a wafer.

As shown in FIG. 1, a processing system 20 may have one or more processors 28 within an enclosure 22. The enclosure 22 may have access openings 24 and 26 to allow workpieces, such as semiconductor wafers, to be moved into and out of the processing system 20, typically via robots. The access openings 24 and 26 may have closures, such as movable panels or windows, for closing off the access openings 24 and 26 during processing, to better contain vapors or gases within the enclosure 22. The enclosure 22 may also be provided with air inlets and exhaust connections, to provide a controlled flow of air through the enclosure.

Referring still to FIG. 1, each processor 28 has a head 50 for loading wafers into and out of a process tank 30. Depending on the specific process performed, a secondary chamber 48, such as a spin rinser dryer, may be associated with each processor 28 within the enclosure. The process tank 30 of each processor may be connected via fluid a supply line and a return line to a filter assembly 60 in the enclosure 22 or at a location remote from the enclosure.

Figure 2:
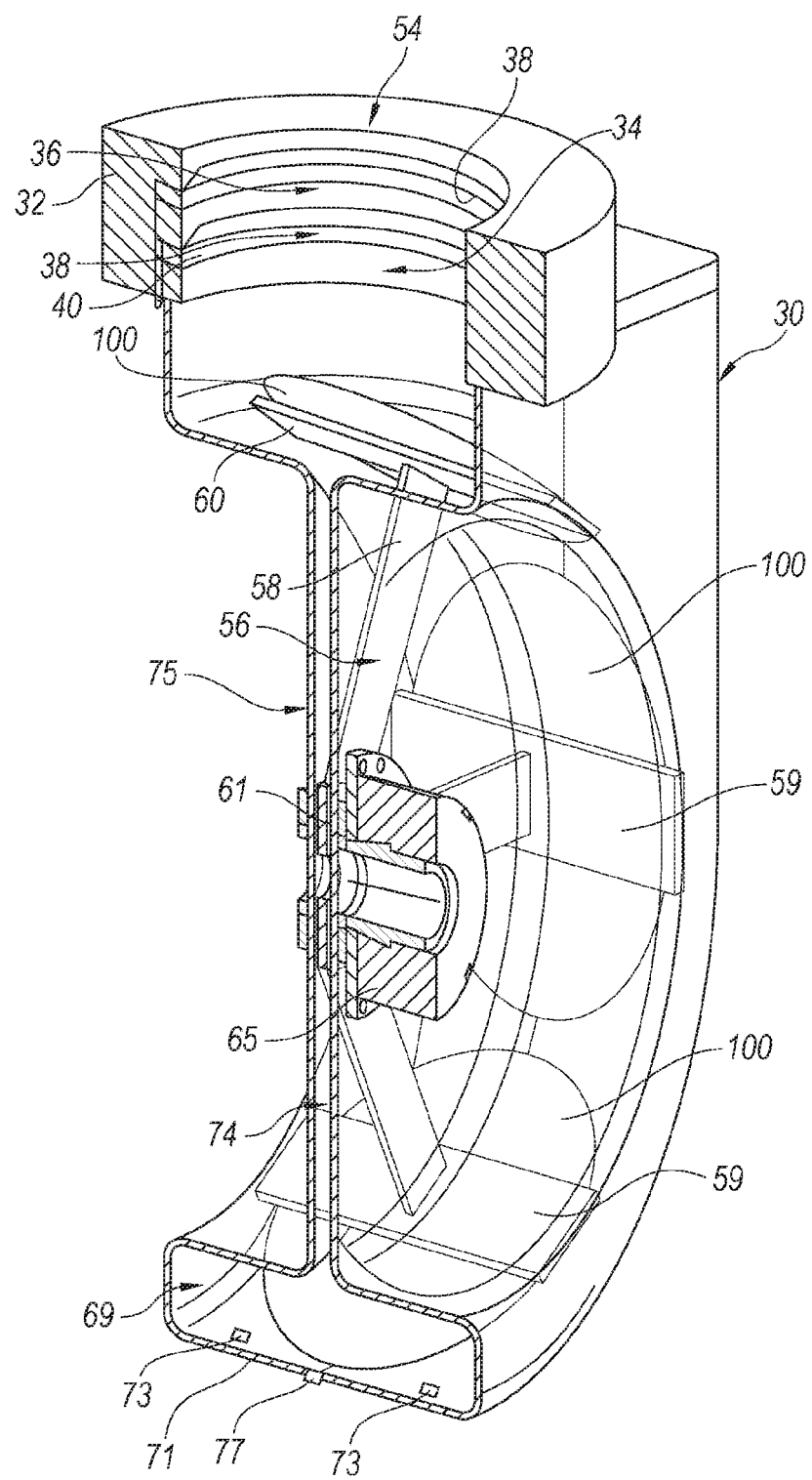
FIG. 2 is a section view of the process tank shown in FIG. 1.

Turning to FIG. 2, a clean housing 32 may be provided at the top of the process tank 30. The clean housing 32, if used, generally includes clean chamber 34 surrounded by a lower or clean chamber drain channel 40, and a rinse chamber 36 surrounded by an upper or rinse chamber drain channel 38. The drain channels 38 and 40 are connected to a facility drain and optionally to a vacuum source. The process tank 30 may have a ring section 69 wide enough to accommodate a wafer 100, and a much narrower central web section 75. A tank rotor 56 has a plurality of arms 58 extending radially outward from a central hub 61, with a holder 59 at the outer end of each arm 58. A tank rotor motor 65 is connected to the tank rotor 56 for rotating the tank rotor 56 in the process tank 30. One or more nozzles 73 and/or sonic transducers 77 may be provided on or in the outer wall 71 of the ring section 69 of the process tank 30.

In use, the head 50 holding a wafer 100 is lowered down into a load port 54 at the top of the process tank 30, as shown in FIG. 2. The head 50 hands the wafer 100 off to a holder 59 on the tank rotor 56. The tank rotor motor 65 rotates the tank rotor 56 moving the wafer 100 in a circular path through the process liquid contained in the process tank 30, and simultaneously moving a subsequent holder 59 to the load port 54 to receive a subsequent wafer 100. The process liquid may be a solvent, optionally heated to e.g., 80 to 120° C. Process liquid may optionally be jetted or sprayed from nozzles 73, which may be submerged in or above the surface of the process liquid. As the tank rotor 56 continues to rotate, the processed wafer 100 returns to the load port 54 and is removed from the process tank 30 via the head 50. Subsequent wafers 100 are similarly processed sequentially. The tank rotor 56 rotates about a rotation axis which is substantially horizontal, i.e., within 15 degrees of horizontal.

Figure 3:
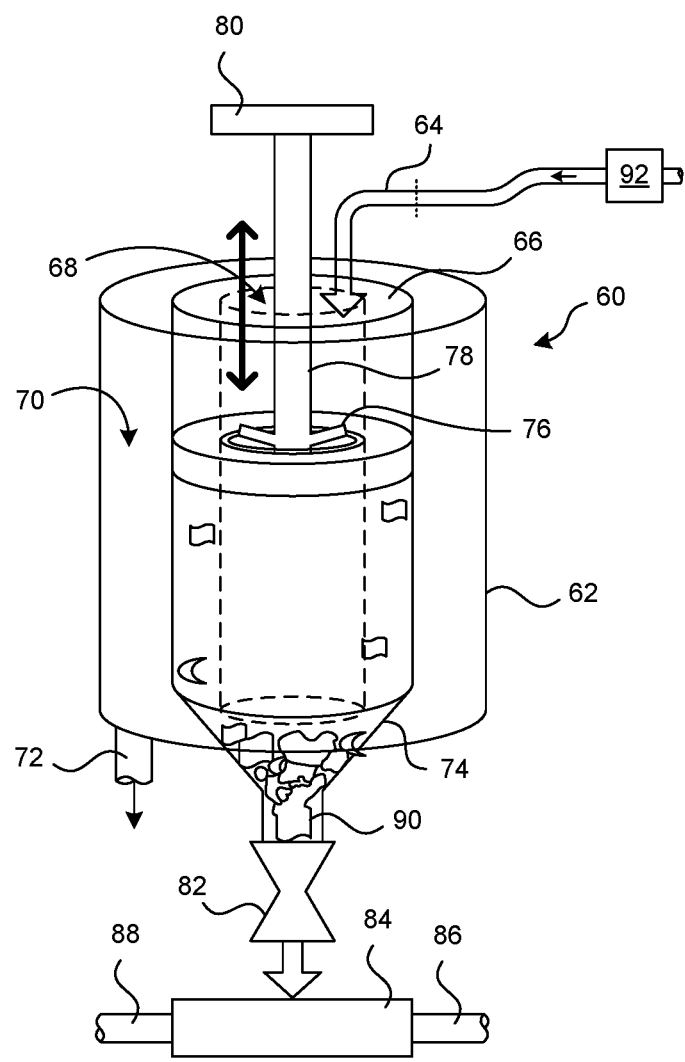
FIG. 3 is a schematic diagram of a first embodiment of the filter shown in FIG. 1.

As shown in the example of FIG. 3, the filter assembly 60 has a filter chamber 68 surrounding the filter media 66. A return chamber 70 is formed to the outside of the filter media 66, between the filter media and a housing 62. In the example shown, the filter chamber 68 is a vertically oriented cylindrical and the filter media 66 and the collection chamber are annular and concentric with the filter chamber 68. However, other shapes may of course be used as well. An inlet 64 on the housing 62 leads into the filter chamber 68. Process liquid is pumped from the process tank 30 to the inlet 64 and into the filter chamber 68. An outlet 72 outlet adjacent to a lower end of the return chamber is connected to a return line for returning filtered process liquid back to the process tank 30.

A collector 74 at the bottom of the filter chamber 68 may funnel solids towards a purge valve 82 and a recovery unit 84. A mechanical scraper has a scraper head 76 on a shaft 78 movable linearly via an actuator 80. The scraper head 76 may include one or more disks or blades contacting the filter media to scrape off solids accumulated on the filter media. The filter media is typically a metal screen or mesh, although other forms of filter media may also be used.

During processing, a pump 92 pumps process liquid from the process tank 30 into the filter chamber 68 via the inlet 64. The pump 92 may be a self cleaning pump, such as a semi-enclosed impeller pump, for pumping the process liquid through the system. Process liquid moves from the filter chamber 68, through the filter media 66, and into the return chamber 70 via the pump 92 exerting positive fluid pressure on the process liquid within the filter assembly.

The solids deposit out on or in the filter media 66. The process liquid in the return chamber 70, largely free of filtered out solids, is pumped back to the process tank 30 via the outlet for reuse.

Periodically, or on an as needed basis, the actuator 80 moves the scraper head 76 linearly through the filter chamber 68. The scraper head 76 slides along the inner annular surface of the filter media 66 scraping off solids and pushing them down into the collector 74. This prevents solids 90 from building up and clogging the filter media. After a specified amount of solids 90 accumulates in the collector 74, the purge valve 82 is opened and the solids 90 are purged to a waste drain.

Alternatively, the purge valve 82 may connect to a recovery unit 84 adapted for separating excess process liquid from the solids 90 and routed back to the inlet 64 via a recovery line 88, and the solids 90 are routed to a recovery unit drain 86 or to a storage vessel for disposal. The recovery unit 84 may also be adapted to recover dissolved or entrained materials, such as precious metals. Opening the purge valve 82 may also allow solids to be purged from the filter media 66 via flushing by rapid movement of the process liquid through the filter chamber 68.

Figure 4:
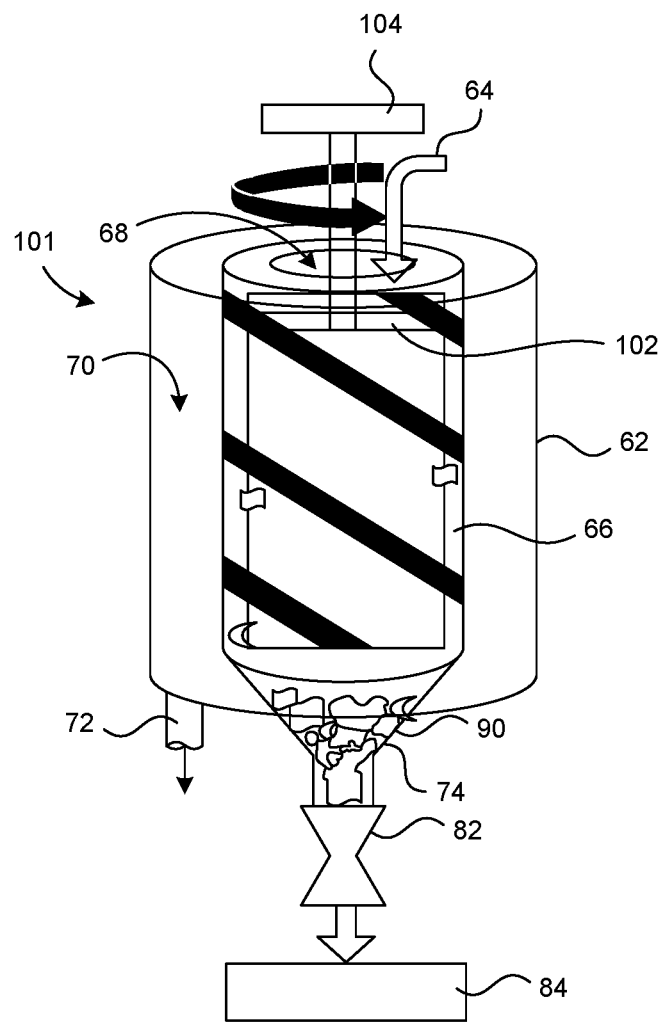
FIG. 4 is a schematic diagram of a second embodiment of the filter shown in FIG. 1.

FIG. 4 shows an alternative self-cleaning filter assembly 101 which operates in the same way as the filter assembly 60 shown in FIG. 3, except that the scraper head 76, shaft 78 and actuator 80 are replaced with a rotary scraper having a filter rotor 102 rotated by a rotary actuator 104. One or more blades or other surfaces of the filter rotor 102 scrape solids off of the filter media 66.

A single self cleaning filter assembly 60 or 101 may be used to filter the process liquid of multiple processors 28 simultaneously to reduce the cost of the processing system 20. Alternatively, two self cleaning filter assemblies 60 or 101 may be used in parallel to prevent down time for maintenance. The self cleaning filter assembly 60 or 101 allows the process liquid to be used for a longer time and reduces the cost of operating the processing system 20.

Operations of the processing system 20, including the pumps, valves, motors, actuators, and head movements described may be controlled via a computer electrically linked to these elements.

The term wafer as used here includes semiconductor material wafers, as well as other substrates on which micro-scale components are formed. The term connected as used relative to fluid components means connected via a pipe or hose, with or without any other physical connection. Thus, novel methods and systems have been shown and described. Various changes and substitutions may of course be made without departing from the spirit and scope of the invention. The invention, therefore, should not be limited, except by the following claims and their equivalents.

The invention claimed is:

1. A method for removing photoresist off of a wafer, comprising:
   moving a wafer having a photoresist film into a bath of a process liquid in a process tank, with the process liquid removing the photoresist film from the wafer, and with some of the removed photoresist film comprising solids;
   pumping process liquid from the process tank to a filter assembly having filter media;
   moving the process liquid through the filter media, with the filter media filtering out the solids from the process liquid;
   returning the filtered process liquid to the process tank;
   scraping the filter media, by rotating a rotor within a filter chamber formed by the filter media, with the rotor having blades contacting the filter media, to move the filtered out solids to a collector in the filter assembly;
   removing the filtered out solids from the collector; and
   removing the wafer from the process tank.

2. The method of claim 1 comprising pumping the process liquid using a semi-enclosed impeller pump.

3. The method of claim 1 comprising moving the process liquid through the filter media via a pump exerting positive fluid pressure on the process liquid within the filter assembly.

4. The method of claim 1 with multiple wafers in the process tank at the same time.

5. The method of claim 4 including loading a plurality of wafers onto a tank rotor in the process tank and rotating the tank rotor to sequentially move each wafer through the process tank.

6. The method of claim 1 comprising removing the filtered out solids from the collector by opening a purge valve connected to the collector.

7. The method of claim 6 comprising moving the filtered out solids from the collector, through the purge valve and into a recovery unit, and separating process liquid from the solids in the recovery unit.

8. The method of claim 6 wherein the process liquid comprises a solvent heated to 80 to 120° C.

9. A system for removing photoresist off of a wafer, comprising:
   a process tank for holding a process liquid which chemically reacts with the photoresist to remove the photoresist off of the wafer;
   a filter assembly connected to the process tank via a supply line and a return line;
   at least one pump for pumping process liquid from the process tank to the filter assembly and back to the process tank;
   filter media in the filter assembly adapted for filtering out solids from the process liquid, with the filter media comprising a vertically oriented cylinder having a cylindrical filter chamber, the supply line connected to an inlet at an upper end of the filter chamber, an annular return chamber surrounding the filter media, and the return line connected to an outlet adjacent to a lower end of the return chamber;
   a scraper movable along the filter media to remove filtered out solids from the filter media, the scraper including a rotor within a filter chamber formed by the filter media, with the rotor having blades contacting the filter media, and a motor for rotating the rotor; and
   a purge valve at a lower end of the filter assembly for purging accumulated solids out of the filter assembly.

10. The system of claim 9 further including a recovery unit connected to the purge valve.

11. The system of claim 9 with the at least one pump comprising a semi-enclosed impeller pump.

12. A method for removing photoresist off of a wafer, comprising:
- moving a wafer having a photoresist film into a bath of a process liquid in a process tank, with the process liquid removing the photoresist film from the wafer, and with some of the removed photoresist film comprising solids;
- pumping process liquid from the process tank into an upper end of a filter chamber in a filter assembly, the filter chamber formed by a cylinder of filter media;
- moving the process liquid radially outward through the filter media and into an annular return chamber surrounding the filter media, with the filter media filtering out the solids from the process liquid;
- returning the filtered process liquid to the process tank via an outlet adjacent to a lower end of the return chamber;
- scraping the filter media to move the filtered out solids to a collector in the filter assembly;
- removing the filtered out solids from the collector; and
- removing the wafer from the process tank.

13. The method of claim 12 including scraping the filter media, by rotating a rotor within a filter chamber formed by the filter media, with the rotor having blades contacting the filter media.

* * * * *